United States Patent [19]

Furutani et al.

[11] Patent Number: 5,783,976
[45] Date of Patent: Jul. 21, 1998

[54] COMPOSITE HIGH FREQUENCY APPARATUS AND METHOD OF FORMING SAME

[75] Inventors: Koji Furutani, Shiga-ken; Norio Nakajima, Takatsuki; Ken Tonegawa, Kyoto; Mitsuhide Kato; Koji Tanaka, both of Shiga-ken; Tatsuya Ueda, Kyoto, all of Japan

[73] Assignee: Murata Manufacturing Co., Ltd., Japan

[21] Appl. No.: 518,667

[22] Filed: Aug. 24, 1995

[30] Foreign Application Priority Data

Sep. 28, 1994 [JP] Japan .................. 6-233204

[51] Int. Cl.⁶ .................. H05K 1/00; H01P 1/20
[52] U.S. Cl. .................. 333/134; 333/247; 333/246; 333/104; 333/204; 327/565; 327/552
[58] Field of Search .................. 333/104, 185, 333/204, 246, 247, 493, 134; 327/552, 564, 565, 567, 503

[56] References Cited

U.S. PATENT DOCUMENTS

| | | | |
|---|---|---|---|
| 4,353,132 | 10/1982 | Saitoh et al. | 455/315 |
| 4,899,118 | 2/1990 | Polinski, Sr. | 333/246 |
| 5,255,318 | 10/1993 | Gurusami et al. | 455/26.1 |
| 5,355,524 | 10/1994 | Higgins, Jr. | 333/204 |
| 5,450,046 | 9/1995 | Kosugi et al. | 333/246 |

FOREIGN PATENT DOCUMENTS 0468801  1/1992  European Pat. Off.

OTHER PUBLICATIONS

IEICE Transactions on Electronics; "Microwave Characteristics of Alumina–Glass Composite Multi–Layer Substrates with Co–Fired Copper Conductors" pp. 912–918.

Primary Examiner—Timothy P. Callahan
Assistant Examiner—Dinh Le
Attorney, Agent, or Firm—Ostrolenk, Faber, Gerb & Soffen, LLP

[57] ABSTRACT

A composite high frequency apparatus includes a high frequency filter and a high frequency switch which have a substantially reduced size and do not require an impedance matching circuit. The apparatus includes a multilayered base having an outer surface with a plurality of diodes, an external ground electrode, an external electrode for a transmission circuit, an external electrode for a receiving circuit, an external electrode for an antenna circuit and external electrodes for control terminals located thereon. A plurality of strip lines, capacitor electrodes and an external grounding electrode are located within the multilayered base.

9 Claims, 4 Drawing Sheets 5,783,976

1

COMPOSITE HIGH FREQUENCY APPARATUS AND METHOD OF FORMING SAME

BACKGROUND OF THE PRIOR ART

The present invention relates to a composite high frequency apparatus, and more specifically, to a composite high frequency apparatus including a high frequency device, for example, a high frequency switch, and a filter and to a method for forming a composite high frequency apparatus by simultaneously forming an interconnected apparatus including at least one high frequency device and at least one filter.

A high frequency switch shown in FIG. 10 is used for switching connections between a transmission circuit TX and an antenna ANT and between a receiving circuit RX and an antenna ANT via signal lines in a portable digital telephone set, for example.

An example of a high frequency device, such as a high frequency switch, has a configuration shown in the circuit diagram of FIG. 11. The high frequency switch 1 is connected to an antenna ANT, a transmission circuit TX and a receiving circuit RX by signal lines V1. A high frequency component, such as a diode D1, has an anode that is connected via a capacitor C1 to the transmission circuit TX. The anode of the diode D1 is also connected to a ground via a series circuit including a strip line L1 forming part of a first transmission line and a capacitor C4. The length of the strip line L1 is substantially equal to or less than $\lambda/4$, where the wavelength of a signal sent from the transmission circuit TX is $\lambda$. A control terminal Vc1 is connected to an intermediate point between the strip line L1 and the capacitor C4. A control circuit (not shown) for switching the high frequency switch 1 is connected to the control terminal Vc1. A series circuit including a strip line L3 forming part of the first transmission line and a capacitor C6 is connected to both ends of the diode D1 (between the anode and the cathode). The cathode of the diode D1 is connected to the antenna ANT via a capacitor C2.

The receiving circuit RX is connected to the capacitor C2, which is connected to the antenna ANT, via a series circuit including a strip line L2 forming part of the first transmission line and a capacitor C3. As in the case of the strip line L1, the length of the strip line L2 is substantially equal to or less than $\lambda/4$. Another high frequency component, for example, a diode D2, has an anode connected to an intermediate point between the strip line L2 and the capacitor C3. The cathode of the diode D2 is connected to a ground via a capacitor C5. Further, a control terminal Vc2 is connected to an intermediate point between the diode D2 and the capacitor C5. A control circuit (not shown) for switching the high frequency switch 1 is connected to the control terminal Vc2 to thereby complete the circuit of the high frequency switch 1.

When a signal is transmitted through the high frequency switch 1, a positive bias voltage is applied to the control terminal Vc1 while a negative bias voltage is applied to the control terminal Vc2. As these voltages work as bias voltages in the forward direction to bias the diodes D1 and D2, the diodes D1 and D2 will be turned ON. At this time, direct currents will be cut by the capacitors C1 to C6 and the voltages applied to the control terminals Vc1 and Vc2 will be applied only on a circuit including the diodes D1 and D2. Thus, the strip line L2 will be grounded by the diode D2 and will resonate at a transmission frequency and impedance will be made almost infinite. consequently, a signal sent

2 from the transmission circuit TX will be transmitted to the antenna ANT through the capacitor C1, the diode D1 and the capacitor C2 without being transmitted to the side of the receiving circuit RX in most cases. Further, because the strip line L1 is grounded via the capacitor C4, the strip line L1 will resonate at a transmission frequency and impedance will be made almost infinite. As a result, leakage of a transmitted signal to the ground side will be prevented.

On the other hand, at the time of receiving a signal, a negative bias voltage will be applied to the control terminal Vc1 while a positive bias voltage will be applied to the control terminal Vc2. As these voltages work as bias voltages in reverse directions relative to the diodes D1 and D2, the diodes D1 and D2 will be turned OFF, and thereby a signal received from the antenna ANT will be transmitted to the receiving circuit RX through the capacitor C2, the strip line L2 and the capacitor C3 without being transmitted to the transmission circuit TX in most cases.

In this way, the high frequency switch 1 allows switching of transmitted and received signals by controlling bias voltages to be applied to the control terminals Vc1 and Vc2.

Further, the series circuit including the strip line L3 and the capacitor C6 are used for increasing impedance on a connection point with the strip line L3 when the diode D1 is OFF and for reducing insertion loss and reflection loss by forming a parallel resonance circuit to be resonated by synthetic capacitance between the capacitor C6 and the diode D1 which is OFF and the inductance component of the strip line L3, and by resonating at its resonance frequency which is substantially the same as a frequency of a received signal.

Besides the circuit construction of a high frequency switch described above, there are various types of high frequency switches available. For example, a high frequency switch as described in Japanese Laid-Open Patent No. 6-197042 and Japanese Laid-Open Patent No. 6197043 and a high frequency switch having a circuit configuration such as the one shown in Japanese Laid-Open Patent No. 7-74762 can also be used.

Further, other high frequency components such as transistors, FETs, and any other suitable device can be used instead of the high frequency components, such as the diodes D1 and D2 described above. In addition, instead of the strip lines L1, L2 and L3, other transmission lines such as coplanar lines and any other suitable components can be used.

Conventionally, however, problems occur when high frequency devices, such as high frequency switches, are used to form a high frequency apparatus by connecting filters to the high frequency devices. The high frequency devices and filters are designed and manufactured differently and independently and are then connected to each other. As a result, the combined high frequency device and filter occupy relatively large areas on a printed circuit board and make the circuit arrangement thereof more complicated. In addition, impedance matching between the high frequency device and the filter must be done to connect the high frequency device and the filter. Therefore, an impedance matching circuit must be designed specifically for the particular high frequency device and filter to be connected to each other. Once the impedance matching filter is designed, the impedance matching filter must be manufactured and connected to the high frequency device and the filter. Consequently, the cost, time and difficulty of manufacturing an apparatus having an interconnected high frequency device and filter with necessary impedance matching circuit is substantially increased.

3

SUMMARY OF THE INVENTION

The preferred embodiments of the present invention solve the problems with the conventional apparatus having an interconnected high frequency device and filter. One object of at least one of the preferred embodiments of the present invention is to provide a composite high frequency apparatus having a substantially reduced size for occupying a reduced amount of space on a printed circuit board. Another object of at least one of the preferred embodiments of the present invention is to simplify the circuit arrangement of a composite high frequency apparatus while eliminating the need for an impedance matching circuit.

In order to solve the problems with the conventional devices described above, the composite high frequency apparatus and method of forming the apparatus according to at least one of the preferred embodiments of the present invention includes a high frequency device mounted on an outer surface of a multilayered base which includes a laminated structure of a plurality of dielectric layers and a signal line connected to a ground electrode, wherein the high frequency device is located at least on the outer surface of the multilayered base or the dielectric layer, a first transmission line connecting the signal line and the ground electrode, and a filter connected to the high frequency component via a second transmission line and signal lines located in the multilayered unit.

Further, a diode is preferably used as a high frequency component, a strip line is preferably used as the transmission line and a high frequency switch is preferably used as the high frequency device. A low-pass filter can be used as the filter. Alternatively, all other suitable high frequency components, transmission lines, high frequency devices and filters can also be used as will be understood from the following description of the preferred embodiments of the present invention.

By locating the high frequency device and the filter on one multilayered base including a plurality of dielectric layers and thereby creating a composite high frequency apparatus, the overall dimension of the apparatus is reduced as compared to a conventional device wherein a high frequency device and a filter are separately made and then connected to each other. Also, by combining the circuit of the high frequency device and the circuit of the filter and simultaneously forming the high frequency device and the filter, desired impedance matching between the circuit of the high frequency device and the circuit of the filter is achieved without the need for a separate impedance matching circuit.

Other features and advantages of the present invention will become apparent from the following description of the invention which refers to the accompanying drawings.

4

Figure 6:
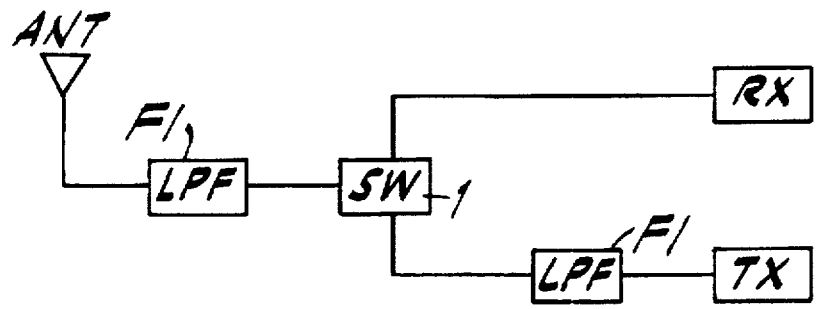
Figure 7:
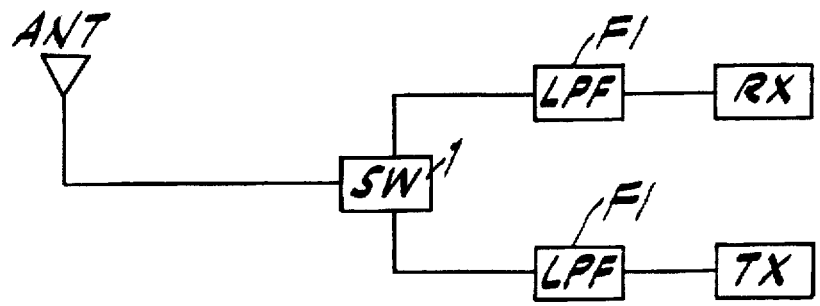
Figure 8:
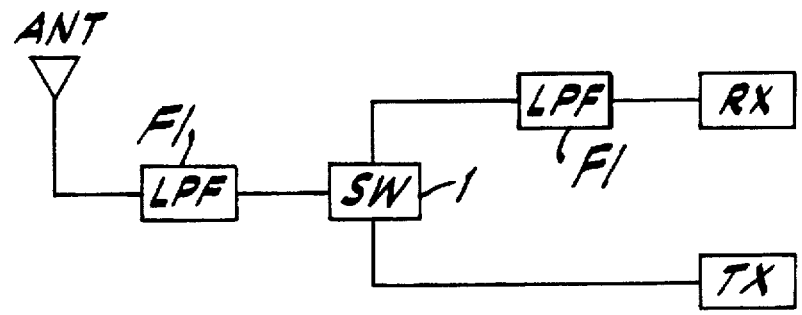
Figure 9:
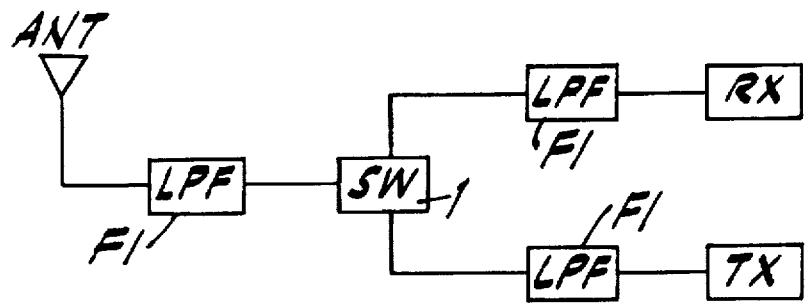
Figure 10:
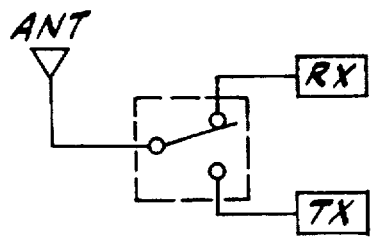
Figure 11:
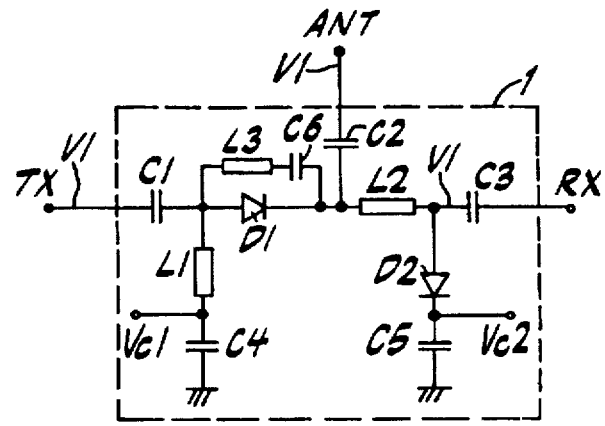

FIG. 6 is a view showing a circuit construction of a composite high frequency apparatus according to another preferred embodiment of the present invention;

FIG. 7 is a view showing a circuit construction of a composite high frequency apparatus according to another preferred embodiment of the present invention;

FIG. 8 is a view showing a circuit construction of a composite high frequency apparatus according to another preferred embodiment of the present invention;

FIG. 9 is a view showing a circuit construction of a composite high frequency apparatus according to another preferred embodiment of the present invention;

FIG. 10 is a view showing a circuit construction of a conventional high frequency device; and FIG. 11 is a diagram showing the circuit of the conventional high frequency device shown in FIG. 10.

DETAILED DESCRIPTION OF PREFERRED EMBODIMENTS

Preferred embodiments of the present invention will be described with reference to the accompanying drawings. Description of elements similar to or the same as the conventional elements shown in FIGS. 10 and 11, will be omitted to avoid redundancy. Such similar elements contained in the preferred embodiments of the present invention will be identified by the same reference numerals and characters used to describe the conventional components.

Figure 1:
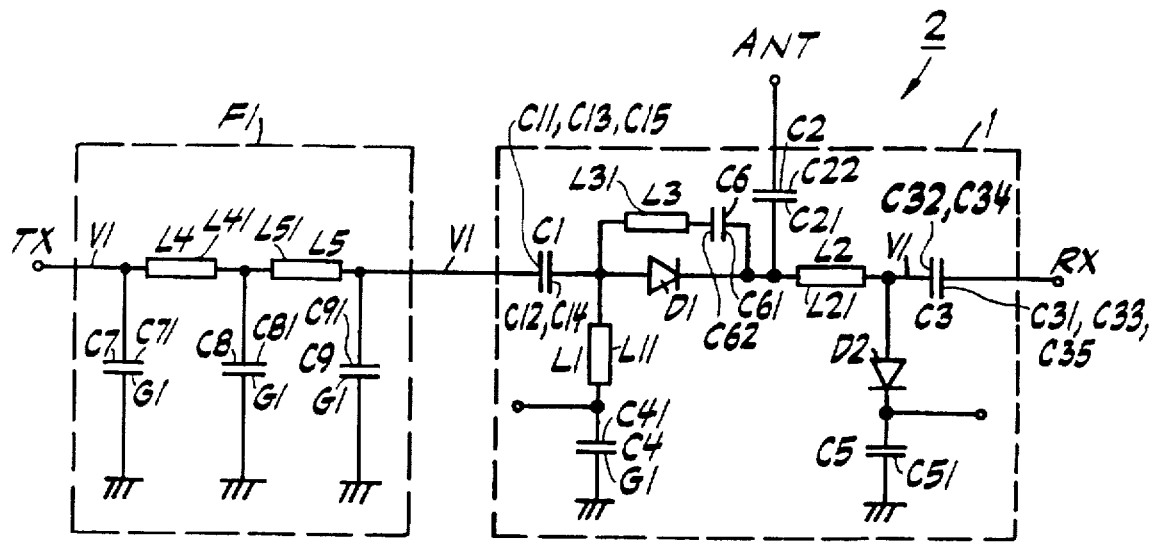
FIG. 1 is a diagram showing a circuit of a composite high frequency apparatus according to a preferred embodiment of the present invention.

FIG. 1 is a diagram showing a circuit of a composite high frequency apparatus 2 according to a preferred embodiment of the present invention. In the preferred embodiment shown in FIG. 1, a filter F1 may preferably be a low-pass filter such as a Butterworth type low-pass filter or any other suitable filter.

The filter F1 is preferably connected between a transmission circuit TX and one end of a capacitor C1 of a high frequency device 1. The filter F1 preferably includes strip lines L4 and L5 which form a second transmission line. The filter F1 also preferably includes capacitors C7, C8 and C9. Description of the connections relating to the filter F1 is omitted because such connections are known.

Figure 2:
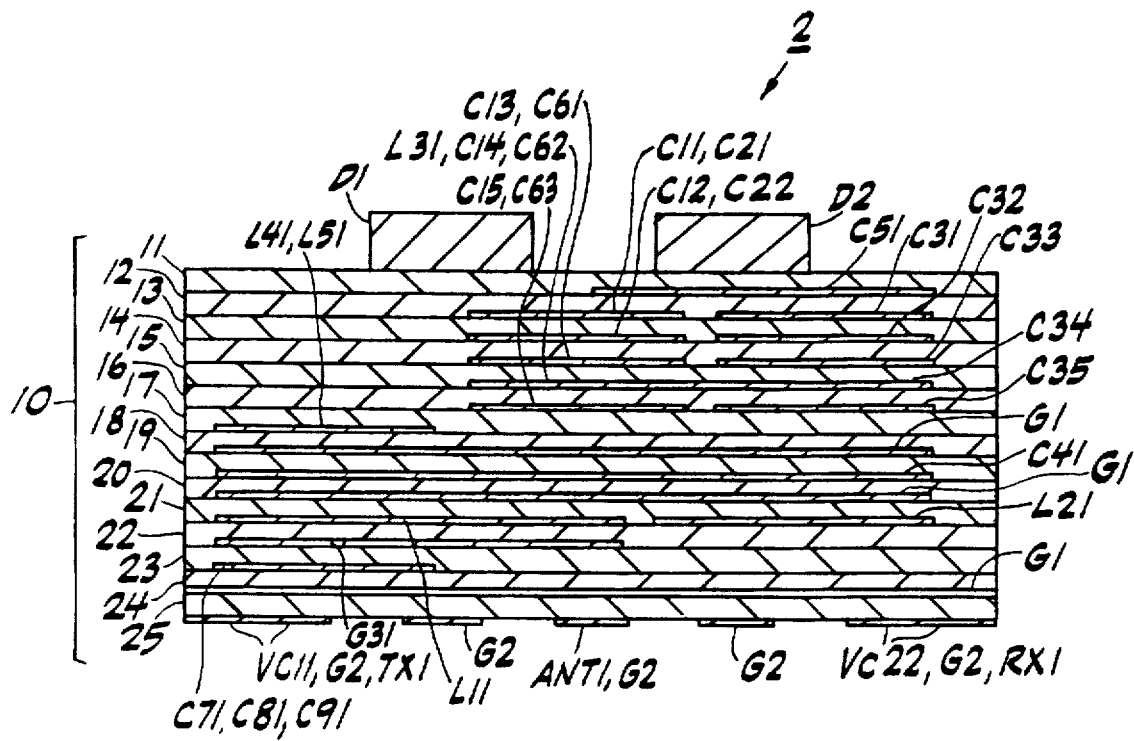
FIG. 2 is a sectional view showing the composite high frequency apparatus shown in FIG. 1.

FIG. 2 is a sectional view showing the composite high frequency apparatus 2 of FIG. 1 wherein the first two characters of each three-character reference in FIG. 2 correspond to a respective two-character reference in FIG. 1. The high frequency apparatus 2 includes a multilayered base 10. As shown in the preferred embodiment of FIG. 3, the multilayered base 10 is preferably formed by laminating dielectric layers 11 to 25 of the first to fifteenth dielectric layers successively from top to bottom. Diodes D1 and D2 are preferably mounted on the first dielectric layer 11. Capacitor electrodes C51, C11, C21, C31, C12, C22, C32, C13, C33, C61, C15, C35, C63, C41, C71, C81 and C91 are preferably located on the layers 12 to 15 of the second to the fifth dielectric layers and the layers 17, 20 and 24 of the seventh, tenth and fourteenth dielectric layers.

Capacitor electrodes C14, C34 and C62 and a strip line electrode L31 are preferably formed on the sixth dielectric layer 16. Strip line electrodes L41, L51, L11, and L21 are preferably formed on the eighth and twelfth dielectric layers 18 and 22. Ground electrodes G1 are preferably formed on the ninth, eleventh, thirteenth and fifteenth dielectric layers 19, 21, 23 and 25.

Figure 3:
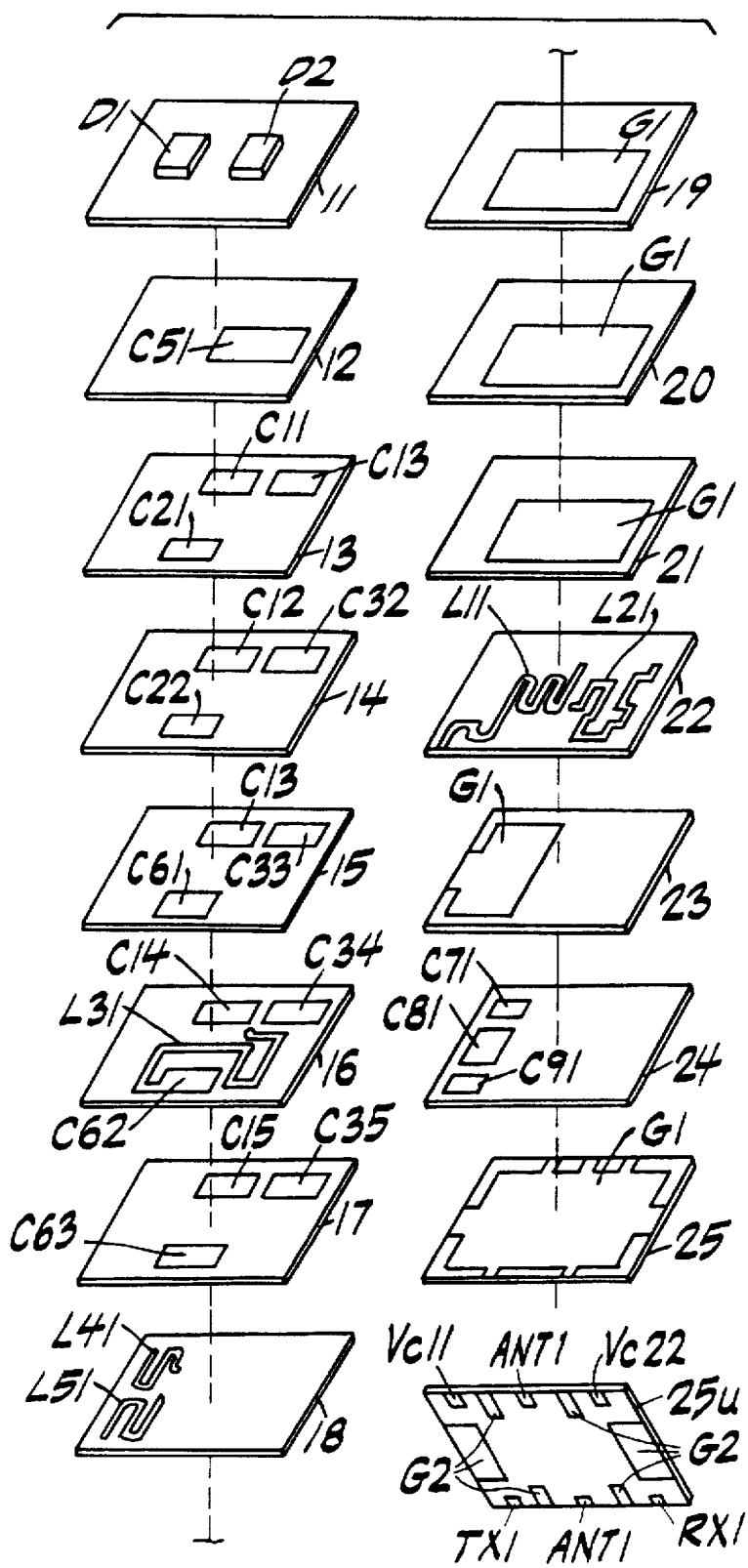
FIG. 3 is an exploded perspective view showing the composite high frequency apparatus of FIG. 1.

Further, an external electrode for a transmission circuit TX1, an external electrode for a receiving circuit RX1, an external electrode for an antenna ANT1, external control electrodes Vc11 and Vc22 and external ground electrodes G2 are preferably formed on a lower surface of the fifteenth dielectric layer 25 (25u in FIG. 3). By forming signal line electrodes (not shown in FIG. 3), at desired locations on the dielectric layers 11 to 25 and by forming external electrodes (not shown in FIG. 3) on the outer surface of the multilayer base 10 and electrically connecting the external electrodes, the composite high frequency apparatus 2 is constructed to have the circuit configuration shown in FIG. 1.

When manufacturing such a composite high frequency apparatus 2, dielectric ceramic green sheets are preferably prepared. On the dielectric ceramic green sheets, electrode paste is preferably printed in accordance with the forms of the respective electrodes and signal lines. Then, by laminating the dielectric ceramic green sheets with electrode paste printed thereon and baking the ceramic green sheets, a multilayered base having laminated dielectric layers will be formed. Further, by printing the electrode paste on the outer surface of the multilayered base and baking the electrode paste, external electrodes will be formed. It is also possible to form the composite high frequency apparatus by printing electrode paste to form external electrodes and baking the electrodes integrally after the dielectric green sheets are laminated.

The composite high frequency apparatus including a high frequency device and a filter formed on one multilayered base by laminating a plurality of dielectric layers has an overall physical dimension that is substantially less than the conventional devices in which a high frequency device and a filter that are separately formed and then connected. The composite high frequency apparatus according to at least one of the preferred embodiments of the present invention achieves a reduced volume and occupies less area on a printed circuit board. Also, by combining the circuit of the high frequency device and the circuit of the filter and simultaneously designing and forming the circuits of the high frequency device and the filter, impedance matching between the circuit of the high frequency device and the circuit of the filter is achieved. Consequently, it is not necessary to design, manufacture and connect an impedance matching circuit between the circuit of the high frequency device and the circuit of the filter. Therefore; the manufacturing and assembly of the circuit of the high frequency device and the circuit of the filter is easier and less expensive than the conventional methods. Further, because the impedance matching circuit is not necessary, the composite high frequency device will be formed in a substantially shorter period of time because the time required for designing and forming the impedance matching circuit is unnecessary.

Further, in the description of the preferred embodiment of FIG. 1, reference was made to the capacitors and strip lines formed on the multilayered base. However, resistance components like chip resistors, printed resistors, and other suitable resistance components and electronic components may be formed on the surface of the multilayered base or may be formed within the multilayered base.

In the preferred embodiment of FIG. 1, the high frequency device and the filter are connected such that the filter F1 is connected between the transmission circuit TX and the high frequency switch 1. However, it is possible to obtain the same effect by selectively connecting the filter F1 between the transmission circuit TX, the receiving circuit RX or the antenna ANT and the high frequency switch 1.

Several alternative preferred embodiments of the present invention will be described in the following paragraphs in relation to FIGS. 4–9.

Figure 4:
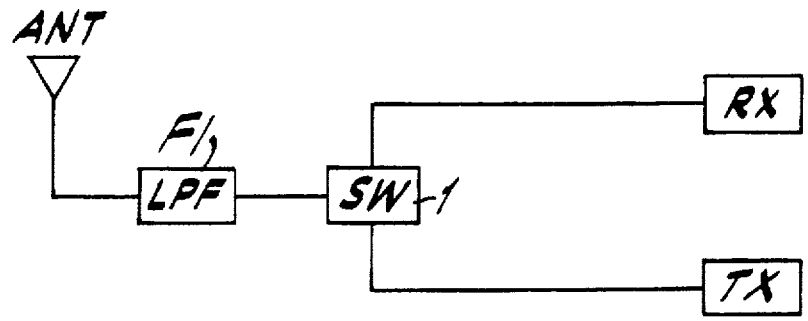
FIG. 4 is a view showing a circuit construction of a composite high frequency apparatus according to another preferred embodiment of the present invention.

The filter F1 may preferably be connected between the antenna ANT and the high frequency switch 1 as shown in FIG. 4.

Figure 5:
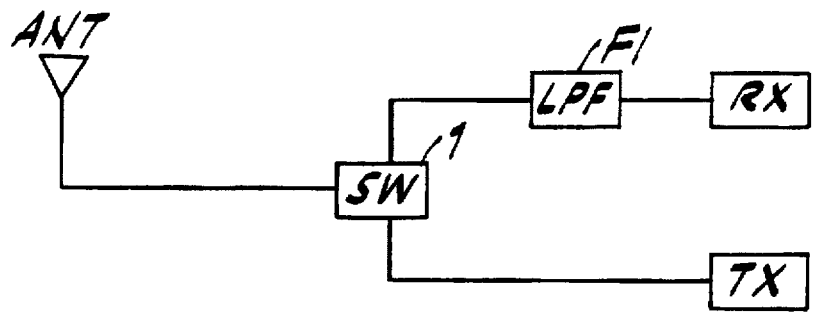
FIG. 5 is a view showing a circuit construction of a composite high frequency apparatus according to another preferred embodiment of the present invention.

The filter F1 may preferably be connected between the receiving circuit RX and the high frequency switch 1 as shown in FIG. 5.

The filter F1 may preferably be connected between the transmission circuit TX and the high frequency switch 1 and between the antenna ANT and the high frequency switch 1 as shown in FIG. 6.

The filter F1 may preferably be connected between the transmission circuit TX and the high frequency switch 1 and between the receiving circuit RX and the high frequency switch 1 as shown in FIG. 7.

The filter F1 may preferably be connected between the receiving circuit RX and the high frequency switch 1 and between the antenna ANT and the high frequency switch 1 as shown in FIG. 8.

The filter F1 may preferably be connected between the transmission circuit TX and the high frequency switch 1, between the receiving circuit RX and the high frequency switch 1 and between the antenna ANT and the high frequency switch 1 as shown in FIG. 9.

Further, in another preferred embodiment of the present invention, a filter, for example, a low-pass filter, may be connected to the high frequency device. However, instead of a low-pass filter, a high-pass filter, a band-pass filter, a band elimination filter and any other suitable filter may be used to be combined with or connected to the high frequency device.

The effect of formation according to at least one of the preferred embodiments of the present invention will be described in detail with respect to an example where a low-pass filter is used.

A composite high frequency apparatus may be constructed by forming a high frequency device such as a high frequency switch including a multilayered base of laminated dielectric layers having the dimensions of about 6.3×5.0×3.0 mm and a low-pass filter having the dimensions of about 4.5×3.2×2.0 mm on one multilayered base. As a result, the entire dimensions of the apparatus is about 6.3×5.0×3.0 mm which are about the same as the entire dimensions of a conventional high frequency switch. The volumes and occupying areas on a printed circuit board of the composite high frequency apparatus produced by at least one preferred embodiment of the present invention are substantially reduced. Further, by combining the circuit of the high frequency device and the circuit of the filter and simultaneously designing and forming the circuits, no impedance matching circuit is needed as with a conventional high frequency device and low-pass filter.

Thus, according to at least one of the preferred embodiments of the present invention, by creating a composite high frequency apparatus by forming a high frequency device and a filter on one multilayered base made of a plurality of dielectric layers, an overall dimension of the apparatus is substantially less than the overall dimension of the conventional high frequency device and filter which are independently designed and formed and then connected. The composite high frequency apparatus according to at least one of the preferred embodiments of the present invention has reduced volume and occupies substantially less area on a printed circuit board. Further, by combining the circuit of the filter and the circuit of the high frequency device and simultaneously designing and forming the circuits, it is possible to achieve impedance matching between the two circuits. Accordingly, it is not necessary to add an impedance matching circuit and the circuit construction of the preferred embodiments is simplified. In addition, the period of time required for designing, forming and connecting the impedance matching circuit as required in the prior art devices is eliminated because an impedance matching circuit is not necessary in the preferred embodiments of the present invention.

Although the present invention has been described in relation to particular preferred embodiments thereof, many other variations and modifications and other uses will become apparent to those skilled in the art. It is preferred, therefore, that the present invention be limited not by the specific disclosure herein, but only by the appended claims.

What is claimed is:

1. A composite high frequency apparatus comprising:

a single ceramic chip including a plurality of laminated ceramic layers and a plurality of co-fired electrodes formed between the laminated ceramic layers, wherein a first part of the ceramic layers and a first part of the co-fired electrodes constitute a high frequency switch comprising capacitors and strip lines, and a second part of the ceramic layers and a second part of the co-fired electrodes constitute a high frequency filter comprising capacitors and strip lines, and the high frequency switch is electrically connected to the high frequency filter within the single ceramic chip.

2. The composite high frequency apparatus of claim 1, wherein the high frequency filter is selected from the group consisting of a low-pass filter, a band-pass filter, a band elimination filter and a high-pass filter.

3. The composite high frequency apparatus of claim 1, wherein the single ceramic chip includes a high frequency component mounted on an outer surface of the single ceramic chip.

4. The composite high frequency apparatus of claim 3, wherein the high frequency component is selected from the group consisting of a diode, a transistor and a FET.

5. The composite high frequency apparatus of claim 1, wherein at least a portion of the first part of the co-fired electrodes and at least a portion of the second part of the co-fired electrodes are formed on a same one of the laminated ceramic layers.

6. The composite high frequency apparatus of claim 1, wherein the high frequency switch has a first terminal for connection to an antenna and a second terminal for connection to a transmission circuit, and the high frequency filter has a third terminal for connection to a receiving circuit.

7. The composite high frequency apparatus of claim 6, wherein the high frequency switch further has a control terminal for receiving a bias voltage.

8. A composite high frequency apparatus comprising:

a single unitary ceramic base comprising a plurality of laminated ceramic layers, and having a first part and a second part therein;

said first part having capacitors, strip lines and a diode therein which are interconnected to constitute a high frequency switch;

said second part having capacitors and strip lines therein which are interconnected to constitute a high frequency filter;

said high frequency switch and said high frequency filter being electrically connected and matched to each other within the single unitary ceramic base.

9. The composite high frequency apparatus of claim 8, wherein at least a portion of the high frequency switch and at least a portion of the high frequency filter are formed on a same one of the laminated ceramic layers.

* * * * *